(12) United States Patent
Freebern

(10) Patent No.: US 7,577,053 B2
(45) Date of Patent: Aug. 18, 2009

(54) MEMORY INCLUDING DEEP POWER DOWN MODE

(75) Inventor: Margaret G. Freebern, Richmond, VT (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 11/598,403

(22) Filed: Nov. 13, 2006

(65) Prior Publication Data

US 2008/0112250 A1    May 15, 2008

(51) Int. Cl.
*G11C 7/00* (2006.01)
(52) U.S. Cl. .................. 365/227; 365/226; 365/228; 365/233
(58) Field of Classification Search .......... 365/227, 365/226, 228, 233
See application file for complete search history.

(56) References Cited

U.S. PATENT DOCUMENTS

| | | | | |
|---|---|---|---|---|
| 6,016,066 | A * | 1/2000 | Ilkbahar | 327/23 |
| 6,477,079 | B2 * | 11/2002 | Kaneko et al. | 365/149 |
| 6,744,687 | B2 | 6/2004 | Koo et al. | |
| 7,154,806 | B2 * | 12/2006 | Kang | 365/230.03 |
| 7,330,067 | B2 * | 2/2008 | Terayama | 327/544 |
| 2005/0122820 | A1 | 6/2005 | Choi et al. | |
| 2005/0201178 | A1 | 9/2005 | Ho et al. | |
| 2005/0243631 | A1 * | 11/2005 | Akiba et al. | 365/222 |

* cited by examiner

*Primary Examiner*—Connie C Yoha
(74) *Attorney, Agent, or Firm*—Dicke, Billig & Czaja, PLLC

(57) ABSTRACT

A memory includes an input pad for receiving an input signal and a first circuit. The first circuit is configured to receive a first signal in response to the input signal and receive a second signal and provide a third signal in response to at least one of the first signal and the second signal indicating a request to enter a deep power down mode. The memory includes a second circuit configured to provide a fourth signal indicating an entry to the deep power down mode in response to the third signal.

26 Claims, 6 Drawing Sheets

MEMORY INCLUDING DEEP POWER DOWN MODE

BACKGROUND

One type of memory is a dynamic random access memory (DRAM). DRAMs have several modes designed to reduce current consumption while the memory device is not being accessed. These modes, such as self refresh, active power down, and precharge power down, reduce the current consumed when the memory device is not being accessed. The largest power savings typically can be obtained by ramping down the internal supply voltages and stopping all operations. In this case, data stored in the memory device is lost, but current consumption is reduced to almost zero. This mode is referred to as deep power down (DPD) mode.

Typically, DPD mode in DRAMs is entered using a synchronous DPD command, which may include a burst stop command with the clock enable (CKE) signal logic low. The Joint Electron Device Engineering Counsel (JEDEC), a semiconductor engineering standardization body, has proposed a new feature for low power double data rate (DDR) DRAMs to set a memory device into DPD mode asynchronously. JEDEC has proposed a new, dedicated input pad that when activated sends the memory device into DPD mode. The proposed input pad will be used in stacked die memory applications to allow devices that share pins to be tested or programmed individually. JEDEC proposes that once packaged for normal operation, the input pad will be driven to a logic low to disable the feature and prevent it from being available to the user.

For these and other reasons, there is a need for the present invention.

SUMMARY

One embodiment of the present invention provides a memory. The memory includes an input pad for receiving an input signal and a first circuit. The first circuit is configured to receive a first signal in response to the input signal and receive a second signal and provide a third signal in response to at least one of the first signal and the second signal indicating a request to enter a deep power down mode. The memory includes a second circuit configured to provide a fourth signal indicating an entry to the deep power down mode in response to the third signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
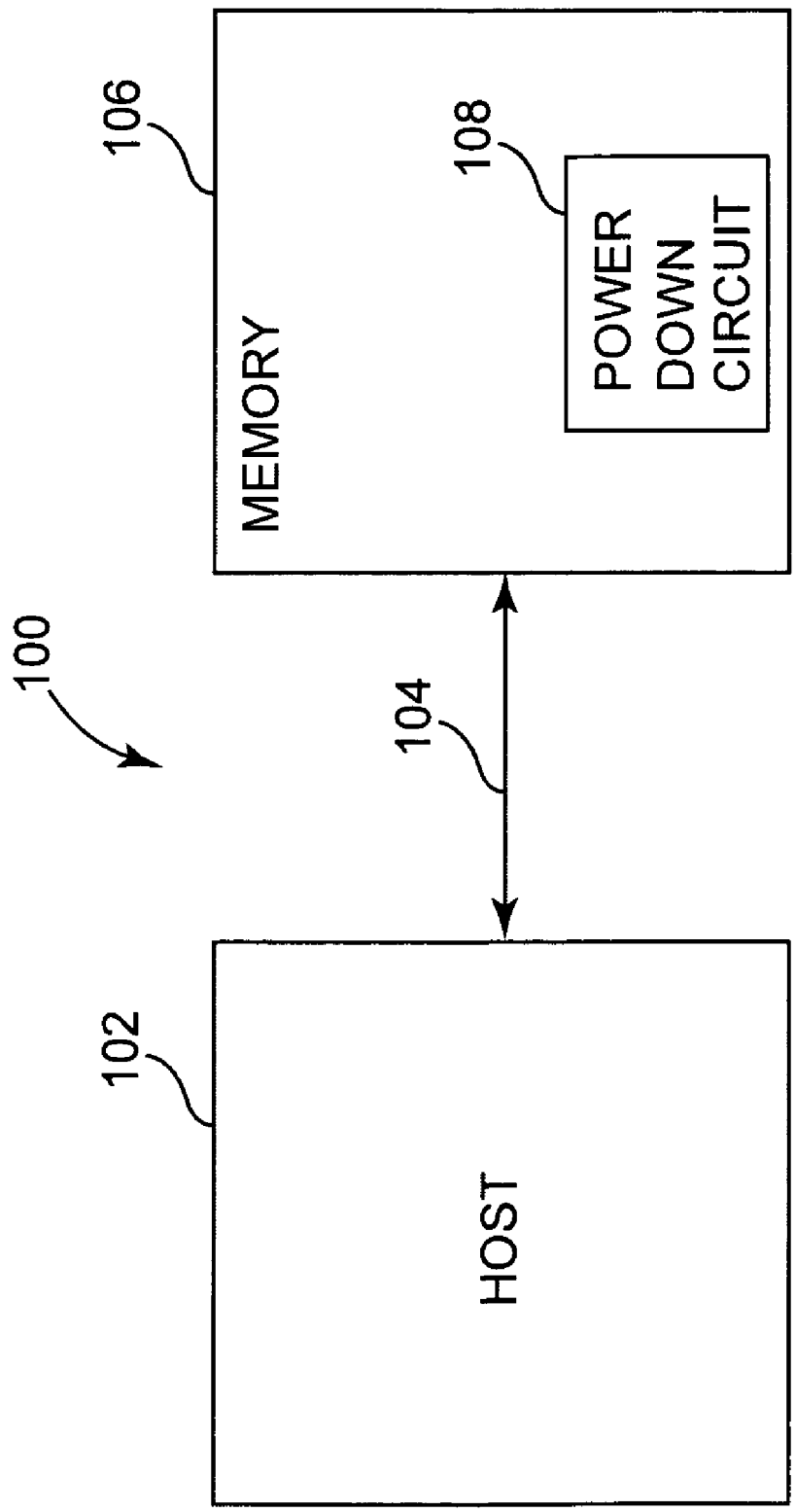
FIG. 1 is a block diagram illustrating one embodiment of a memory device.

FIG. 1 is a block diagram illustrating one embodiment of a memory system 100. Memory system 100 includes a host 102 and a memory 106. Host 102 is electrically coupled to memory 106 through memory communication path 104. Memory 106 includes a power down circuit 108. Host 102 reads data from memory 106 and writes data to memory 106 through memory communication path 104. Host 102 also controls power down circuit 108 through memory communication path 104.

Power down circuit 108 includes control circuitry for implementing the JEDEC proposed deep power down (DPD) input pad. When a logic high signal is applied to the DPD input pad of power down circuit 108, memory 106 asynchronously enters deep power down mode. To exit the deep power down mode, a logic low signal is applied to the DPD input pad of power down circuit 108 with the clock enable (CKE) signal logic high. In one embodiment, the deep power down mode is used in stacked die configurations during the testing of memory 106. The deep power down mode allows separate die that share pins in stacked die configurations to be tested and programmed individually. In other embodiments, the asynchronous deep power down mode control circuitry may be used for purposes other than for testing. Power down circuit 108 also includes optional glitch protection against positive and negative glitches of the signal applied to the DPD input pad.

Host 102 includes logic, firmware, and/or software for controlling the operation of memory 106. In one embodiment, host 102 is a microprocessor or other suitable device capable of passing a clock signal, address signals, command signals, and data signals to memory 106 though memory communication path 104 for reading data from and writing data to memory 106. Host 102 passes a clock signal, address signals, command signals, and data signals to memory 106 through memory communication path 104 to read data from and write data to memory 106 and to control power down circuit 108. In one embodiment, host 102 is part of a test system for testing memory 106. In other embodiments, host 102 is part of another suitable system for operating memory 106.

Memory 106 includes circuits for communicating with host 102 through memory communication path 104, for reading and writing data in memory 106, and for controlling power down circuit 108. Memory 106 includes a random access memory (RAM), such as a dynamic random access memory (DRAM), a synchronous dynamic random access memory (SDRAM), a double data rate synchronous dynamic random access memory (DDR-SDRAM), a low power SDRAM (e.g., MOBILE-RAM), or another suitable memory. Memory 106 responds to memory read requests from host 102 and passes the requested data to host 102. Memory 106 responds to write requests from host 102 and stores data in memory 106 passed from host 102. Memory 106 also responds to command signals from host 102 for controlling power down circuit 108.

Figure 2:
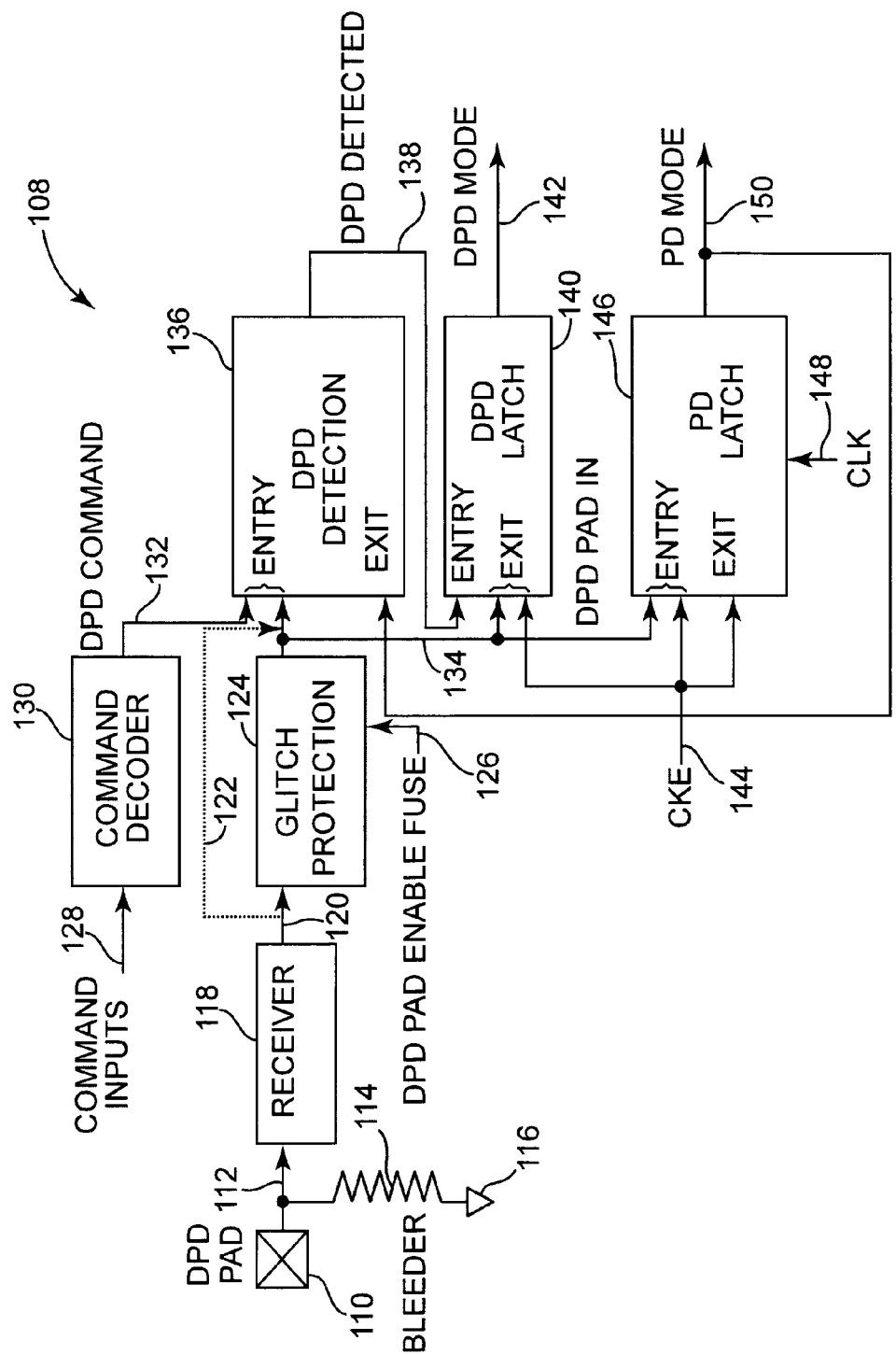
FIG. 2 is a block diagram illustrating one embodiment of a power down circuit.

FIG. 2 is a block diagram illustrating one embodiment of power down circuit 108. Power down circuit 108 includes DPD pad 110, bleeder 114, receiver 118, glitch protection circuit 124, command decoder 130, DPD detection circuit 136, DPD latch circuit 140, and power down (PD) latch circuit 146. DPD pad 110 is electrically coupled to one side of bleeder 114 and the input of receiver 118 through signal path 112. The other side of bleeder 114 is electrically coupled to common or ground 116. The output of receiver 118 is electrically coupled to a first input of glitch protection circuit 124 through signal path 120. A second input of the glitch protection circuit 124 receives a DPD PAD ENABLE FUSE signal on signal path 126. The output of glitch protection circuit 124 is electrically coupled to a first entry input of DPD detection circuit 136, a first exit input of DPD latch circuit 140, and a first entry input of PD latch circuit 146 through DPD PAD IN signal path 134. In one embodiment, glitch protection circuit 124 is optionally removed or bypassed in power down circuit 108 by electrically coupling signal path 120 to DPD PAD IN signal path 134 through signal path 122.

The input of command decoder 130 receives command inputs on signal path 128. An output of command decoder 130 is electrically coupled to a second entry input of DPD detection circuit 136 through DPD COMMAND signal path 132. The output of DPD detection circuit 136 is electrically coupled to the entry input of DPD latch circuit 140 through DPD DETECTED signal path 138. The second exit input of DPD latch circuit 140 and the second entry input of PD latch circuit 146 receive a clock enable (CKE) signal on CKE signal path 144. The output of DPD latch circuit 140 provides the DPD MODE signal on DPD MODE signal path 142. An input of PD latch circuit 146 receives a clock (CLK) signal on CLK signal path 148. The output of PD latch circuit 146 provides the PD MODE signal and is electrically coupled to the exit input of DPD detection circuit 136 through PD MODE signal path 150.

Host 102 provides command inputs to command decoder 130 through memory communications path 104 and signal path 128. Command decoder 130 decodes the command inputs. In response to a command input indicating a request to enter the deep power down mode, command decoder 130 provides the DPD COMMAND signal on signal path 132.

DPD pad 110 is an input pad that receives an input signal from an external source or from host 102 to provide the signal on signal path 112 indicating a request that memory 106 enter the deep power down mode asynchronously. Bleeder 114 dissipates the signal applied to DPD pad 110 when the applied signal transitions from a logic high level to a logic low level. Receiver 118 senses and receives the external signal on signal path 112 from DPD pad 110 to provide an internal DPD PAD RECEIVED signal on signal path 120.

Glitch protection circuit 124 receives the DPD PAD RECEIVED signal on signal path 120 and the DPD PAD ENABLE FUSE signal on signal path 126 to provide the DPD PAD IN signal on signal path 134. Glitch protection circuit 124 protects against both positive and negative glitches of the DPD PAD RECEIVED signal on signal path 120. In one embodiment, in response to a logic low DPD PAD ENABLE FUSE signal on signal path 126, glitch protection circuit 124 is disabled and the DPD PAD RECEIVED signal on signal path 120 is passed to provide the DPD PAD IN signal on signal path 134 through bypass signal path 122. In another embodiment, in response to a logic low DPD PAD ENABLE FUSE signal on signal path 126, glitch protection circuit 124 is disabled to disable the asynchronous portion of power down circuit 108. In other embodiments, the asynchronous portion of power down circuit 108 is disabled by using fuses and/or metal options in other portions of power down circuit 108, such as in signal path 112 or signal path 134.

DPD detection circuit 136 receives the DPD COMMAND signal on signal path 132, the DPD PAD IN signal on signal path 134, and the PD MODE signal on signal path 150 to provide the DPD DETECTED signal on signal path 138. In response to a logic high DPD COMMAND signal or a logic high DPD PAD IN signal indicating a request to enter deep power down mode, DPD detection circuit 136 provides a logic high DPD DETECTED signal. In response to a logic low PD MODE signal, a logic low DPD COMMAND signal, and a logic low DPD PAD IN signal, DPD detection circuit 136 provides a logic low DPD DETECTED signal.

DPD latch circuit 140 receives the DPD DETECTED signal on signal path 138, the DPD PAD IN signal on signal path 134, and the CKE signal on signal path 144 to provide the DPD MODE signal on signal path 142. In response to a logic high DPD DETECTED signal, DPD latch circuit 140 provides a logic high DPD MODE signal to enter deep power down mode. In deep power down mode, circuits within memory 106 such as generators and receivers are disabled and data stored in memory 106 is lost. In response to a logic low DPD PAD IN signal and a logic high CKE signal, DPD latch circuit 140 provides a logic low DPD MODE signal thereby exiting deep power down mode.

PD latch circuit 146 receives the DPD PAD IN signal on signal path 134, the CKE signal on signal path 144, and the CLK signal on signal path 148 to provide the PD MODE signal on signal path 150. In response to a logic high DPD PAD IN signal and a logic low CKE signal, PD latch circuit 146 provides a logic high PD MODE signal to enter power down mode. In power down mode, circuits within memory 106, such as command and address receivers are disabled. In response to a logic high CKE signal, PD latch circuit 146 provides a logic low PD MODE signal synchronized to the CLK signal thereby exiting power down mode.

In operation, a command input signal is received from host 102 by command decoder 130 or a logic high signal is applied to DPD pad 110 to indicate a request to enter deep power down mode. If the request to enter deep power down mode is received by command decoder 130, command decoder 130 provides a logic high DPD COMMAND signal. If the request to enter deep power down mode is applied to DPD pad 110, the applied signal is received by receiver 118 and glitch protection circuit 124 provides a logic high DPD PAD IN signal if the applied signal is a real request and not a glitch.

In response to either the logic high DPD COMMAND signal or the logic high DPD PAD IN signal, DPD detection circuit 136 provides a logic high DPD DETECTED signal. In response to the DPD DETECTED signal, DPD latch circuit 140 provides a logic high DPD MODE signal activating the deep power down mode for memory 106. Also in response to the DPD PAD IN signal, PD latch circuit 146 provides a logic high PD MODE signal activating the power down mode for memory 106. In response to a logic high CKE signal, a logic low signal applied to DPD pad 110, and no command input requesting deep power down mode, DPD latch circuit 140 provides a logic low DPD MODE signal to deactivate the deep power down mode and PD latch circuit 146 provides a logic low PD MODE signal to deactivate the power down mode. In other embodiments, the logic levels of the signals are reversed.

Figure 3:
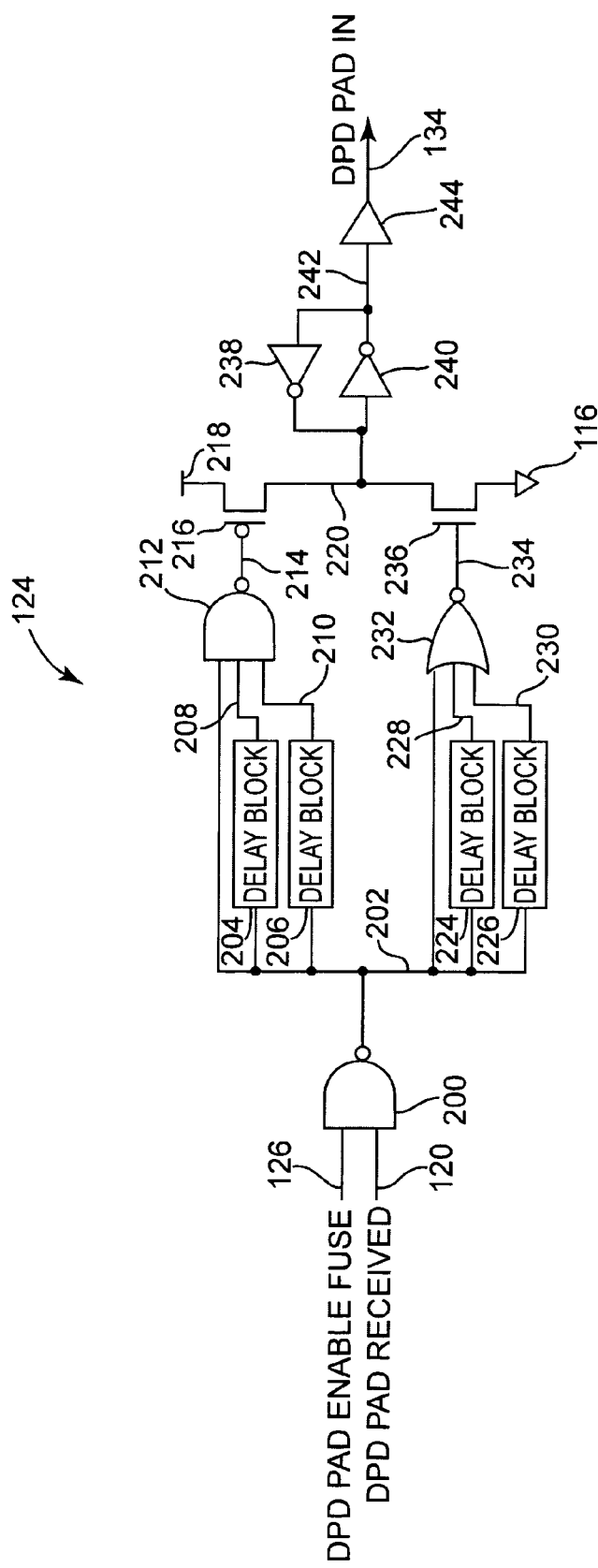
FIG. 3 is a schematic diagram illustrating one embodiment of a glitch protection circuit.

FIG. 3 is a schematic diagram illustrating one embodiment of glitch protection circuit 124. Glitch protection circuit 124 includes NAND gates 200 and 212, delay blocks 204, 206, 224, and 226, NOR gate 232, transistors 216 and 236, inverters 238 and 240, and buffer 244. A first input of NAND gate 200 receives the DPD PAD ENABLE FUSE signal on signal path 126. A second input of NAND gate 200 receives the DPD PAD RECEIVED signal on signal path 120. The output of NAND gate 200 is electrically coupled to a first input of NAND gate 212, the input of delay block 204, the input of delay block 206, a first input of NOR gate 232, the input of delay block 224, and the input of delay block 226 through signal path 202.

The output of delay block 204 is electrically coupled to a second input of NAND gate 212 through signal path 208. The output of delay block 206 is electrically coupled to a third input of NAND gate 212 through signal path 210. The output of NAND gate 212 is electrically coupled to the gate of transistor 216 through signal path 214. The output of delay block 224 is electrically coupled to a second input of NOR gate 232 through signal path 228. The output of delay block 226 is electrically coupled to a third input of NOR gate 232 through signal path 230. The output of NOR gate 232 is electrically coupled to the gate of transistor 236 through signal path 234.

One side of the source-drain path of transistor 216 is electrically coupled to reference voltage 218. The other side of the source-drain path of transistor 216 is electrically coupled to the output of inverter 238, the input of inverter 240, and one side of the source-drain path of transistor 236 through signal path 220. The other side of the source-drain path of transistor 236 is electrically coupled to common or ground 116. The output of inverter 240 is electrically coupled to the input of inverter 238 and the input of buffer 244 through signal path 242. The output of buffer 244 provides the DPD PAD IN signal on signal path 134.

NAND gate 200 receives the DPD PAD ENABLE FUSE signal on signal path 126 and the DPD PAD RECEIVED signal on signal path 120 to provide the signal on signal path 202. In response to a logic high DPD PAD ENABLE FUSE signal and a logic high DPD PAD RECEIVED signal, NAND gate 200 outputs a logic low signal on signal path 202. In response to a logic low DPD PAD ENABLE FUSE signal or a logic low DPD PAD RECEIVED signal, NAND gate 200 outputs a logic high signal on signal path 202.

Delay block 204 delays the signal on signal path 202 to provide the signal on signal path 208. Delay block 206 delays the signal on signal path 202 to provide the signal on signal path 210. In one embodiment, the delay of delay block 206 is greater than the delay of delay block 204. Delay block 224 delays the signal on signal path 202 to provide the signal on signal path 228. Delay block 226 delays the signal on signal path 202 to provide the signal on signal path 230. In one embodiment, the delay of delay block 226 is greater than the delay of the delay block 224. In one embodiment, the delay of delay block 204 equals the delay of delay block 224, and the delay of delay block 206 equals the delay of delay block 226. In other embodiments, other suitable delay lengths are used.

NAND gate 212 receives the signal on signal path 202, the signal on signal path 208, and the signal on signal path 210 to provide the signal on signal path 214. In response to a logic high signal on signal path 202, a logic high signal on signal path 208, and a logic high signal on signal path 210, NAND gate 212 outputs a logic low signal on signal path 214. In response to a logic low signal on signal path 202, a logic low signal on signal path 208, or a logic low signal on signal path 210, NAND gate 212 outputs a logic high signal on signal path 214.

In one embodiment, transistor 216 is a p-channel metal oxide semiconductor (MOS) field effect transistor (FET). In response to a logic low signal on signal path 214, transistor 216 turns on (conducting) to connect reference voltage 218 to signal path 220 thereby providing a logic high signal on signal path 220. In response to a logic high signal on signal path 214, transistor 216 turns off (not conducting).

NOR gate 232 receives the signal on signal path 202, the signal on signal path 228, and the signal on signal path 230 to provide the signal on signal path 234. In response to a logic low signal on signal path 202, a logic low signal on signal path 228, and a logic low signal on signal path 230, NOR gate 232 outputs a logic high signal on signal path 234. In response to a logic high signal on signal path 202, a logic high signal on signal path 228, or a logic high signal on signal path 230, NOR gate 232 outputs a logic low signal on signal path 234.

In one embodiment, transistor 236 is an n-channel MOSFET. In response to a logic high signal on signal path 234, transistor 236 turns on to connect common or ground 116 to signal path 220 thereby providing a logic low signal on signal path 220. In response to a logic low signal on signal path 234, transistor 236 turns off.

Inverter 240 inverts the signal on signal path 220 to provide the signal on signal path 242. Inverter 238 inverts the signal on signal path 242 to provide the signal on signal path 220. Inverters 238 and 240 latch the signal on signal path 220. Buffer 244 buffers the signal on signal path 242 to provide the DPD PAD IN signal on signal path 134.

In operation, in response to a logic low DPD PAD ENABLE FUSE signal, glitch protection circuit 124 is disabled and the DPD PAD IN signal remains logic low. In response to a logic high DPD PAD ENABLE FUSE signal, glitch protection circuit 124 is enabled. With glitch protection circuit 124 enabled, and in response to a logic high DPD PAD RECEIVED signal, transistor 216 is turned off by the output of NAND gate 212. If the DPD PAD RECEIVED signal remains logic high long enough as determined by delay blocks 224 and 226, transistor 236 is turned on by the output of NOR gate 232. With transistor 236 turned on, the DPD PAD IN signal transitions to logic high.

With glitch protection circuit 124 enabled, and in response to a logic low DPD PAD RECEIVED signal, transistor 236 is turned off by the output of NOR gate 232. If the DPD PAD RECEIVED signal remains logic low long enough as determined by delay blocks 204 and 206, transistor 216 is turned on by the output of NAND gate 212. With transistor 216 turned on, the DPD PAD IN signal transitions to logic low. Therefore, with glitch protection circuit 124 enabled, the logic level of the DPD PAD IN signal equals the logic level of the DPD PAD RECEIVED signal if the DPD PAD RECEIVED signal is not a glitch.

Figure 4:
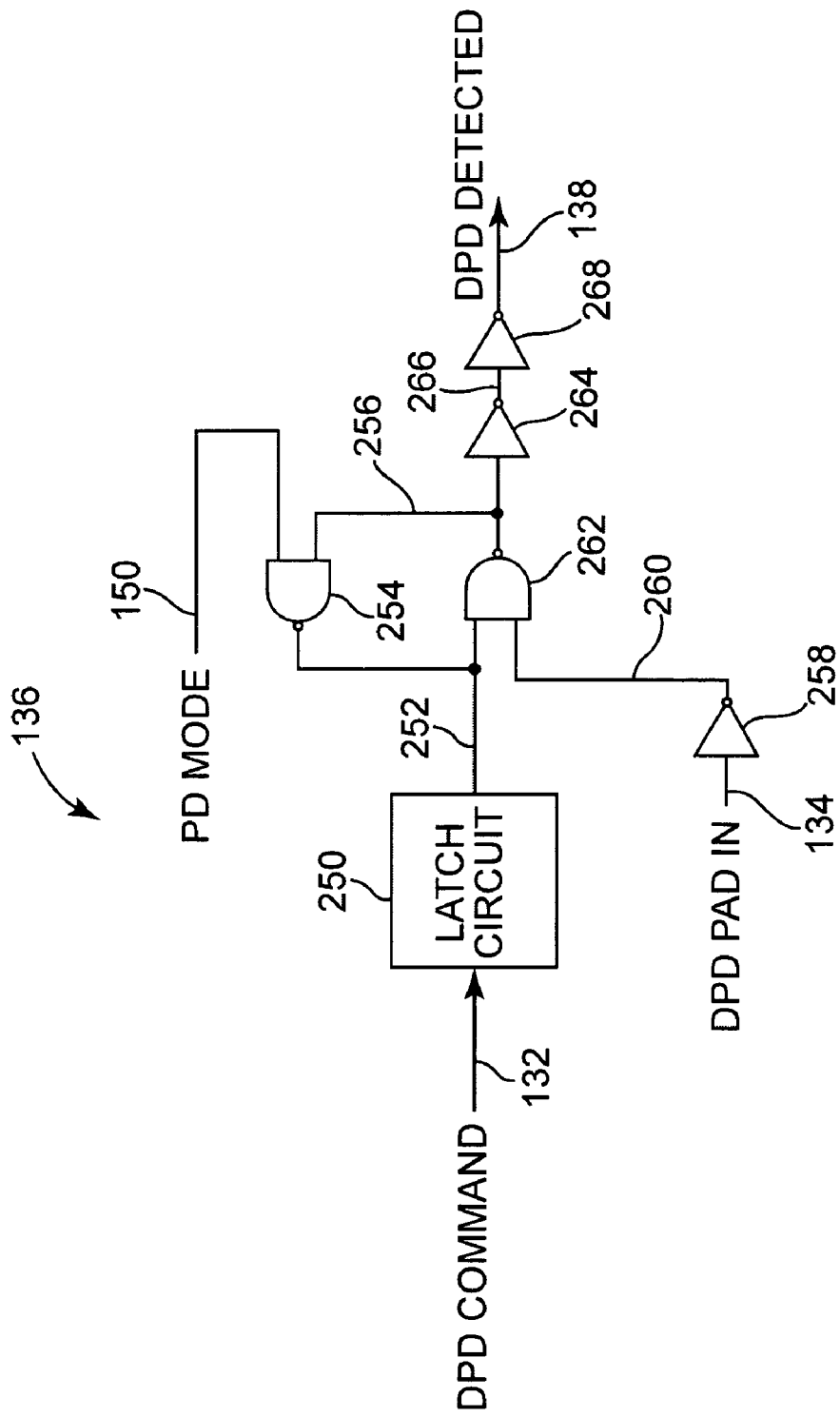
FIG. 4 is a schematic diagram illustrating one embodiment of a deep power down detection circuit.

FIG. 4 is a schematic diagram illustrating one embodiment of DPD detection circuit 136. DPD detection circuit 136 includes latch circuit 250, NAND gates 254 and 262, and inverters 258, 264, and 268. The input of latch circuit 250 receives the DPD COMMAND signal on signal path 132. The output of latch circuit 250 is electrically coupled to a first input of NAND gate 262 and the output of NAND gate 254 through signal path 252. The input of inverter 258 receives the DPD PAD IN signal on signal path 134. The output of inverter 258 is electrically coupled to a second input of NAND gate 262 through signal path 260. The output of NAND gate 262 is electrically coupled to a first input of NAND gate 254 and the input of inverter 264 through signal path 256. A second input of NAND gate 254 receives the PD MODE signal on signal path 150. The output of inverter 264 is electrically coupled to the input of inverter 268 through signal path 266. The output of inverter 268 provides the DPD DETECTED signal on signal path 138.

Latch circuit 250 receives the DPD COMMAND signal on signal path 132 to provide the signal on signal path 252. Latch circuit 250 latches and inverts the DPD COMMAND signal. In response to a logic high DPD COMMAND signal, latch circuit 250 provides a logic low signal on signal path 252. In response to a logic low DPD COMMAND signal, latch circuit 250 provides a logic high signal on signal path 252.

Inverter 258 inverts the DPD PAD IN signal on signal path 134 to provide the signal on signal path 260. NAND gate 262 receives the signal on signal path 252 and the signal on signal path 260 to provide the signal on signal path 256. In response to a logic high signal on signal path 252 and a logic high signal on signal path 260, NAND gate 262 outputs a logic low signal on signal path 256. In response to a logic low signal on signal path 252 or a logic low signal on signal path 260, NAND gate 262 outputs a logic high on signal path 256.

NAND gate 254 receives the PD MODE signal on signal path 150 and the signal on signal path 256 to provide the signal on signal path 252. In response to a logic high PD MODE signal and a logic high signal on signal path 256, NAND gate 254 outputs a logic low signal on signal path 252. In response to a logic low PD MODE signal or a logic low signal on signal path 256, NAND gate 254 outputs a logic high signal on signal path 252. NAND gates 254 and 262 form a reset/set (RS) NAND latch. Inverter 264 inverts the signal on signal path 256 to provide the signal on signal path 266. Inverter 268 inverts the signal on signal path 266 to provide the DPD DETECTED signal on signal path 138.

In operation, in response to either a logic high DPD COMMAND signal or a logic high DPD PAD IN signal, NAND gate 262 outputs a logic high signal on signal path 256. In response to the logic high signal on signal path 256, a logic high DPD DETECTED signal is provided indicating a request to enter deep power down mode. In response to a logic low DPD PAD IN signal and a logic low PD MODE signal, NAND gate 262 outputs a logic low signal on signal path 256. In response to the logic low signal on signal path 256, a logic low DPD DETECTED signal is provided.

Figure 5:
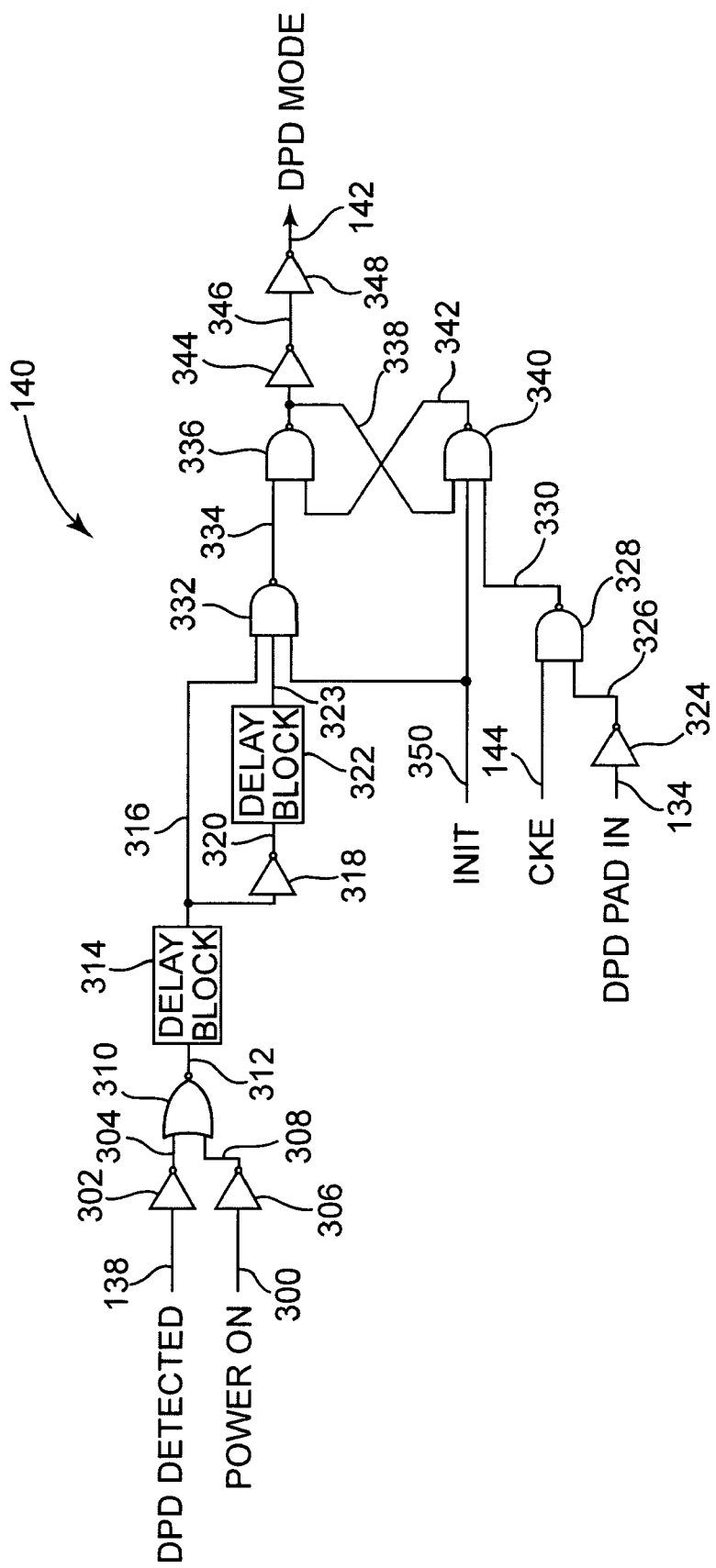
FIG. 5 is a schematic diagram illustrating one embodiment of a deep power down latch circuit.

FIG. 5 is a schematic diagram illustrating one embodiment of DPD latch circuit 140. DPD latch circuit 140 includes inverters 302, 306, 318, 324, 344, and 348, NOR gate 310, delay blocks 314 and 322, and NAND gates 328, 332, 336, and 340. The input of inverter 302 receives the DPD DETECTED signal on signal path 138. The output of inverter 302 is electrically coupled to a first input of NOR gate 310 through signal path 304. The input of inverter 306 receives the POWER ON signal on signal path 300. The output of inverter 306 is electrically coupled to a second input of NOR gate 310 through signal path 308. The output of NOR gate 310 is electrically coupled to the input of delay block 314 through signal path 312.

The output of delay block 314 is electrically coupled to a first input of NAND gate 332 and the input of inverter 318 through signal path 316. The output of inverter 318 is electrically coupled to the input of delay block 322 through signal path 320. The output of delay block 322 is electrically coupled to a second input of NAND gate 332 through signal path 323. A third input of NAND gate 332 and a first input of NAND gate 340 receive an initialization (INIT) signal on signal path 350. The output of NAND gate 332 is electrically coupled to a first input of NAND gate 336 through signal path 334.

The input of inverter 324 receives the DPD PAD IN signal on signal path 134. The output of inverter 324 is electrically coupled to a first input of NAND gate 328 through signal path 326. A second input of NAND gate 328 receives the CKE signal on signal path 144. The output of NAND gate 328 is electrically coupled to a second input of NAND gate 340 through signal path 330. The output of NAND gate 340 is electrically coupled to a second input of NAND gate 336 through signal path 342. The output of NAND gate 336 is electrically coupled to a third input of NAND gate 340 and the input of inverter 344 through signal path 338. The output of inverter 344 is electrically coupled to the input of inverter 348 through signal path 346. The output of inverter 348 provides the DPD MODE signal on signal path 142.

Inverter 302 inverts the DPD DETECTED signal on signal path 138 to provide the signal on signal path 304. Inverter 306 inverts the POWER ON signal on signal path 300 to provide the signal on signal path 308. NOR gate 310 receives the signal on signal path 304 and the signal on signal path 308 to provide the signal on signal path 312. In response to a logic low signal on signal path 304 and a logic low signal on signal path 308, NOR gate 310 outputs a logic high signal on signal path 312. In response to a logic high signal on signal path 304 or a logic high signal on signal path 308, NOR gate 310 outputs a logic low signal on signal path 312.

Delay block 314 delays the signal on signal path 312 to provide the signal on signal path 316. Inverter 318 inverts the signal on signal path 318 to provide the signal on signal path 320. Delay block 322 delays the signal on signal path 320 to provide the signal on signal path 323.

NAND gate 332 receives the signal on signal path 316, the signal on signal path 323, and the INIT signal on signal path 350 to provide the signal on signal path 334. In response to a logic high signal on signal path 316, a logic high signal on signal path 323, and a logic high INIT signal, NAND gate 332 outputs a logic low signal on signal path 334. In response to a logic low signal on signal path 316, a logic low signal on signal path 323, or a logic low INIT signal, NAND gate 332 outputs a logic high signal on signal path 334.

Inverter 324 inverts the DPD PAD IN signal on signal path 134 to provide the signal on signal path 326. NAND gate 328 receives the CKE signal on signal path 144 and the signal on signal path 326 to provide the signal on signal path 330. In response to a logic high CKE signal and a logic high signal on signal path 326, NAND gate 328 outputs a logic low signal on signal path 330. In response to a logic low CKE signal or a logic low signal on signal path 326, NAND gate 328 outputs a logic high signal on signal path 330.

NAND gate 336 receives the signal on signal path 334 and the signal on signal path 342 to provide the signal on signal path 338. In response to a logic high signal on signal path 334 and a logic high signal on signal path 342, NAND gate 336 outputs a logic low signal on signal path 338. In response to a logic low signal on signal path 334 or a logic low signal on signal path 342, NAND gate 336 outputs a logic high signal on signal path 338.

NAND gate 340 receives the signal on signal path 338, the INIT signal on signal path 350, and the signal on signal path 330 to provide the signal on signal path 342. In response to a logic high signal on signal path 338, a logic high INIT signal, and a logic high signal on signal path 330, NAND gate 340 outputs a logic low signal on signal path 342. In response to a logic low signal on signal path 338, a logic low INIT signal, or a logic low signal on signal path 330, NAND gate 340 outputs a logic high signal on signal path 342. NAND gates 336 and 340 form a RS NAND latch. Inverter 344 inverts the signal on signal path 338 to provide the signal on signal path 346. Inverter 348 inverts the signal on signal path 346 to provide the DPD MODE signal on signal path 142.

In operation, the POWER ON signal is logic high to indicate memory 106 is powered on and logic low to indicate memory 106 is powered off. The INIT signal is pulsed logic low to reset the RS NAND latch formed by NAND gates 336 and 340 during an initialization or reset routine to set the DPD MODE signal logic low. After the initialization or reset routine, the INIT signal remains logic high. With a logic high POWER ON signal and a logic low DPD DETECTED signal, the DPD MODE signal remains logic low. In response to a logic high POWER ON signal and a logic high DPD DETECTED signal, NOR gate 310 provides a logic high signal on signal path 312. In response to the logic high signal on signal path 312, NAND gate 332 outputs a logic low pulse on signal path 334 to set the RS NAND latch formed by NAND gates 336 and 340. With the RS NAND latch formed by NAND gates 336 and 340 set, the DPD MODE signal transitions to logic high to activate the deep power down mode.

The DPD MODE signal remains logic high as long as the CKE signal remains logic low and the DPD PAD IN signal remains logic high. In response to a logic high CKE signal and a logic low DPD PAD IN signal, NAND gate 328 provides a logic low signal on signal path 330 to reset the RS NAND latch formed by NAND gates 336 and 340. With the RS NAND latch formed by NAND gates 336 and 340 reset, the DPD MODE signal transitions to logic low to deactivate the deep power down mode.

Figure 6:
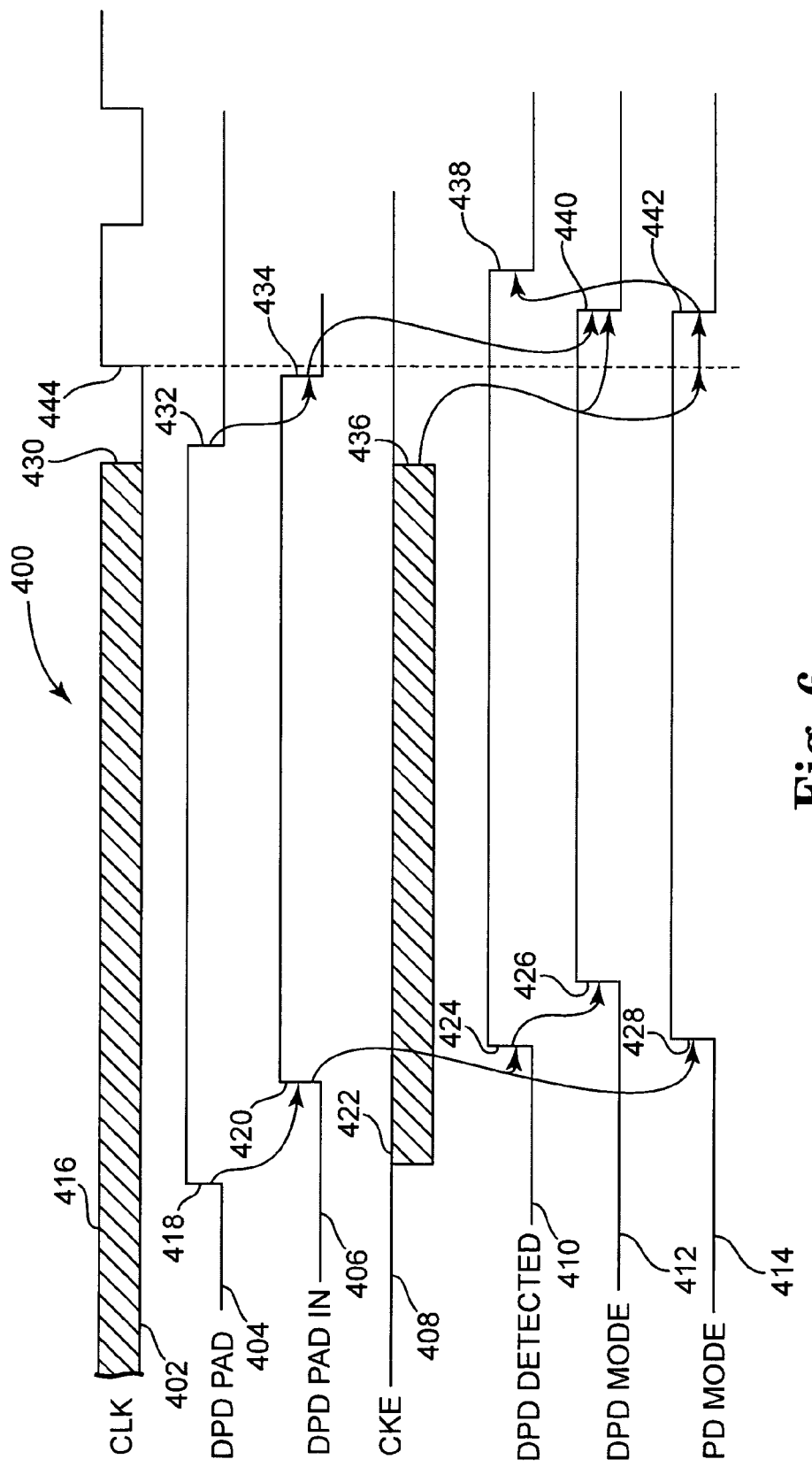
FIG. 6 is a timing diagram illustrating one embodiment of signals within the power down circuit during operation.

FIG. 6 is a timing diagram 400 illustrating one embodiment of signals within power down circuit 108 during operation. Timing diagram 400 includes CLK signal 402 on signal path 148, DPD PAD signal 404 on DPD pad 110, DPD PAD IN signal 406 on signal path 134, CKE signal 408 on signal path 144, DPD DETECTED signal 410 on signal path 138, DPD MODE signal 412 on signal path 142, and PD MODE signal 414 on signal path 150.

An external DPD PAD signal 404 applied to DPD pad 110 transitions to logic high at 418 indicating a request to enter deep power down mode. Since the request to enter deep power mode in response to rising edge 418 of DPD PAD signal 404 is an asynchronous request, the value of clock signal 402 does not matter as indicated at 416. In response to rising edge 418 of DPD PAD signal 404, glitch protection circuit 124, or receiver 118 if glitch protection circuit 124 is bypassed, provides rising edge 420 of DPD PAD IN signal 406. With DPD PAD IN signal 406 logic high, the value of CKE signal 408 does not matter as indicated at 422.

In response to rising edge 420 of DPD PAD IN signal 406, DPD detection circuit 136 provides rising edge 424 of DPD DETECTED signal 410, and PD latch circuit 146 provides rising edge 428 of PD MODE signal 414. In response to rising edge 424 of DPD DETECTED signal 410, DPD latch circuit 140 provides rising edge 426 of DPD MODE signal 412. With PD MODE signal 414 logic high, the power down mode of memory 106 is active. With DPD MODE signal 412 logic high, the deep power down mode of memory 106 is active.

An external DPD PAD signal 404 applied to DPD pad 110 transitions to logic low at 432 indicating a request to exit deep power down mode. Host 102 provides rising edge 436 of CKE signal 408. In response to rising edge 436 of CKE signal 408, clock signal 402 is enabled at 430. In response to falling edge 432 of DPD PAD signal 404, glitch protection circuit 124, or receiver 118 if glitch protection circuit 124 is bypassed, provides falling edge 434 of DPD PAD IN signal 406. In response to rising edge 436 of CKE signal 408 and falling edge 434 of DPD PAD IN signal 406, DPD latch circuit 140 provides falling edge 440 of DPD MODE signal 412. In response to rising edge 436 of CKE signal 408 and rising edge 444 of clock signal 402, PD latch circuit 146 provides falling edge 442 of PD MODE signal 414. In response to falling edge 442 of PD MODE signal 414, DPD detection circuit 136 provides falling edge 438 of DPD DETECTED signal 410. With PD MODE signal 414 logic low, the power down mode of memory 106 is not active. With DPD MODE signal 426 logic low, the deep power down mode of memory 106 is not active.

Embodiments of the present invention provide an asynchronous deep power down mode for a memory, such as a low power DRAM. The deep power down mode circuitry includes an optional glitch protection circuit and control circuits for asynchronously entering and exiting a deep power down mode. The deep power down mode is entered and exited asynchronously based on an external signal applied to a deep power down input pad.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
   a dedicated input pad for receiving an external signal indicating a request to enter a deep power down mode;
   a first circuit configured to receive a first signal in response to the external signal and receive a second signal and provide a third signal in response to at least one of the first signal and the second signal indicating a request to enter the deep power down mode; and
   a second circuit configured to provide a fourth signal indicating an entry to the deep power down mode in response to the third signal.

2. The memory of claim 1, wherein the second circuit is configured to provide the fourth signal indicating an exit from the deep power down mode in response to an active clock enable signal and the first signal not indicating a request to enter the deep power down mode.

3. The memory of claim 1, further comprising:
   a glitch protection circuit configured to provide the first signal in response to the external signal having a constant logic level for a predetermined period.

4. The memory of claim 3, wherein the glitch protection circuit is configured to be disabled in response to a fuse enable signal.

5. The memory of claim 1, further comprising:
   a command decoder configured to provide the second signal.

6. The memory of claim 1, further comprising:
a bleeder coupled to the input pad.

7. The memory of claim 1, further comprising:
a third circuit configured to provide a fifth signal indicating an entry to a power down mode in response to the first signal indicating a request to enter the deep power down mode.

8. The memory of claim 7, wherein the first circuit is configured to provide a sixth signal indicating an exit from the deep power down mode in response to the fifth signal indicating an exit from the power down mode.

9. A memory comprising:
a dedicated input pad for receiving an external signal indicating a request to enter a deep power down mode;
a glitch protection circuit configured to provide a first signal in response to the external signal being free from glitches;
a deep power down detection circuit configured to provide a deep power down detected signal in response to at least one of the first signal and a second signal; and
a deep power down latch circuit configured to activate a deep power down mode signal in response to the deep power down detected signal.

10. The memory of claim 9, further comprising:
a command decoder configured to provide the second signal.

11. The memory of claim 9, further comprising:
a power down latch circuit configured to activate a power down mode signal in response to the first signal.

12. The memory of claim 9, wherein the deep power down latch circuit is configured to deactivate the deep power down mode signal in response to the first signal not indicating a request to enter the deep power down mode and an active clock enable signal.

13. The memory of claim 9, wherein the memory comprises a dynamic random access memory.

14. A memory comprising:
a dedicated input pad for receiving an external signal indicating a request to enter a deep power down mode;
means for receiving a first signal in response to the external signal and a second signal in response to a decoded command and provide a deep power down detected signal in response to at least one of the first signal and the second signal indicating a request to enter the deep power down mode; and
means for activating a deep power down mode signal in response to the deep power down detected signal and deactivating the deep power down mode signal in response to an active clock enable signal and the first signal not indicating a request to enter the deep power down mode.

15. The memory of claim 14, further comprising:
means for providing the first signal in response to the external signal having a constant logic level for a predetermined period.

16. The memory of claim 15, further comprising:
means for one of selectively activating and selectively deactivating the means for providing the first signal.

17. The memory of claim 14, further comprising:
means for providing a power down mode signal in response to the first signal indicating a request to enter the deep power down mode.

18. A method for operating a memory, the method comprising:
receiving on a dedicated input pad an external signal indicating a request to enter a deep power down mode;
receiving a first signal in response to the external signal;
receiving a second signal in response to a decoded command signal;
providing a third signal in response to at least one of the first signal and the second signal indicating a request to enter the deep power down mode; and
activating a fourth signal in response to the third signal to enter the deep power down mode.

19. The method of claim 18, further comprising:
providing the first signal in response to the external signal having a constant logic level for a predetermined period.

20. The method of claim 18, further comprising:
providing a fifth signal in response to the first signal indicating a request to enter the deep power down mode to enter a power down mode.

21. The method of claim 18, further comprising:
deactivating the fourth signal in response to an active clock enable signal and the first signal not indicating a request to enter the deep power down mode to exit the deep power down mode.

22. A method of operating a memory, the method comprising:
receiving on a dedicated input pad an external signal indicating a request to asynchronously enter a deep power down mode;
providing a first signal in response to the external signal being free from glitches;
providing a deep power down detected signal in response to at least one of the first signal and a second signal, the second signal received in response to a decoded command signal; and
activating a deep power down mode signal in response to the deep power down detected signal.

23. The method of claim 22, further comprising:
bleeding the external signal in response to the external signal transitioning from a logic high level to a logic low level.

24. The method of claim 22, further comprising:
providing a power down mode signal in response to the first signal indicating a request to enter the deep power down mode.

25. The method of claim 22, further comprising:
deactivating the deep power down mode signal in response to an active clock enable signal and the first signal not indicating a request to enter the deep power down mode.

26. A memory comprising:
an input pad for receiving an input signal;
a first circuit configured to receive a first signal in response to the input signal and receive a second signal and provide a third signal in response to at least one of the first signal and the second signal indicating a request to enter a deep power down mode;
a second circuit configured to provide a fourth signal indicating an entry to the deep power down mode in response to the third signal; and
a third circuit configured to provide a fifth signal indicating an entry to a power down mode in response to the first signal indicating a request to enter the deep power down mode,
wherein the first circuit is configured to provide a sixth signal indicating an exit from the deep power down mode in response to the fifth signal indicating an exit from the power down mode.

* * * * *